(12) United States Patent
Kitamura et al.

(10) Patent No.: US 7,432,597 B2
(45) Date of Patent: Oct. 7, 2008

(54) SEMICONDUCTOR DEVICE AND METHOD OF MANUFACTURING THE SAME

(75) Inventors: Takuya Kitamura, Kanagawa (JP); Takashi Sakoh, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/138,452

(22) Filed: May 27, 2005

(65) Prior Publication Data
US 2005/0266636 A1    Dec. 1, 2005

(30) Foreign Application Priority Data
May 31, 2004    (JP) .............................. 2004-162340

(51) Int. Cl.
*H01L 23/48* (2006.01)
(52) U.S. Cl. .................. 257/758; 257/296; 257/774; 257/E23.145; 257/E23.151; 257/E23.175; 257/303; 257/E23.142; 257/E23.143

(58) Field of Classification Search .................. 257/303, 257/758, E23.145, 774, E23.151, E23.175, 257/E23.142, E23.143
See application file for complete search history.

(56) References Cited

U.S. PATENT DOCUMENTS

| 6,130,449 | A  | * | 10/2000 | Matsuoka et al. ........... 257/296 |
| 6,258,649 | B1 | * | 7/2001  | Nakamura et al. .......... 438/238 |
| 6,461,911 | B2 | * | 10/2002 | Ahn et al. ................... 438/253 |
| 2002/0024140 | A1 | * | 2/2002 | Nakajima et al. ........... 257/758 |
| 2002/0195632 | A1 | * | 12/2002 | Inoue et al. ................. 257/296 |
| 2003/0134490 | A1 |   | 7/2003  | Inuzuka |

FOREIGN PATENT DOCUMENTS

JP    2002-289817    10/2002

* cited by examiner

*Primary Examiner*—Brook Kebede
*Assistant Examiner*—Mohammad T Karimy
(74) *Attorney, Agent, or Firm*—Young & Thompson

(57) ABSTRACT

In a semiconductor device including a memory region and a logic region, one or more of a plurality of logic transistor connection plugs, buried in a first insulating layer and connected to a diffusion layer of a logic transistor, are left unconnected to a first interconnect provided in an upper layer.

9 Claims, 10 Drawing Sheets

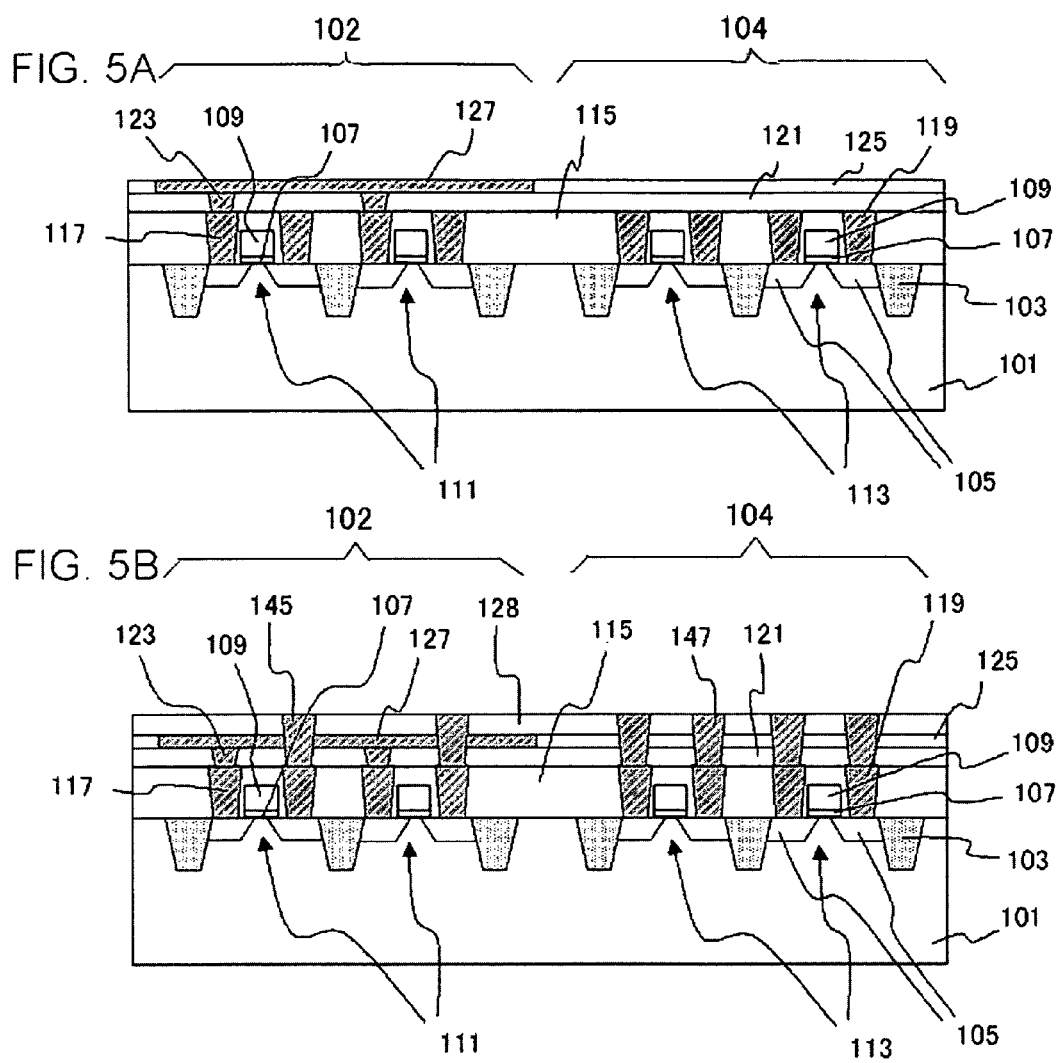

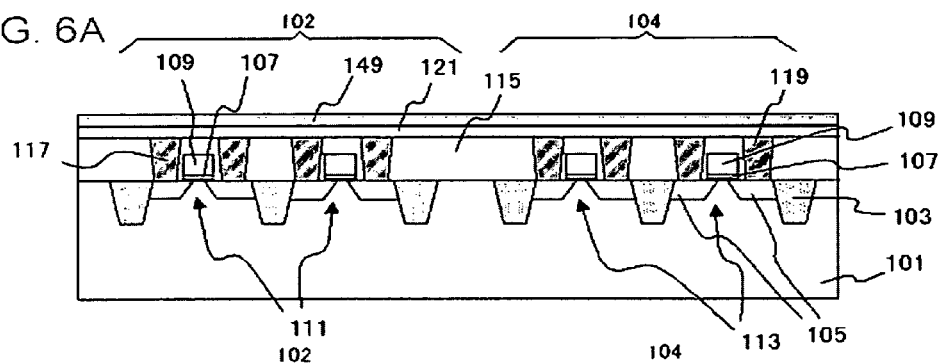
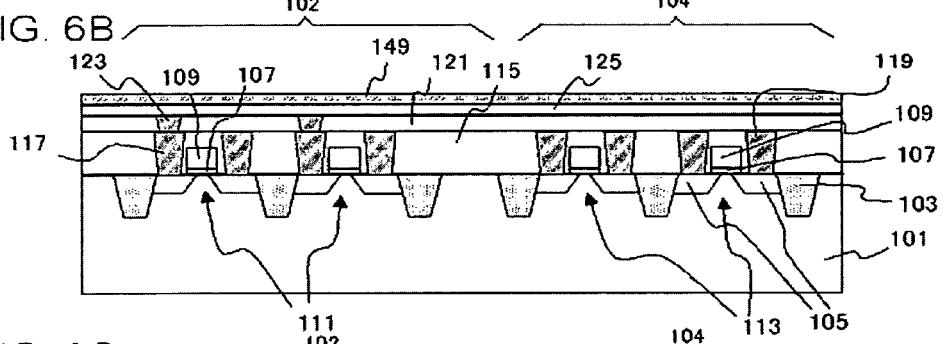
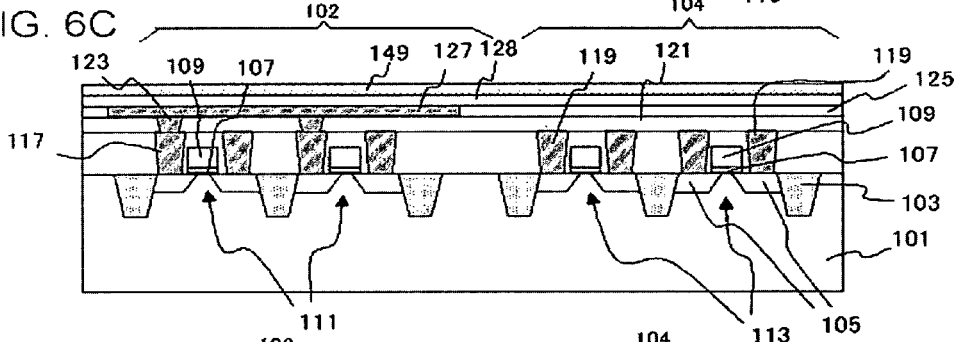
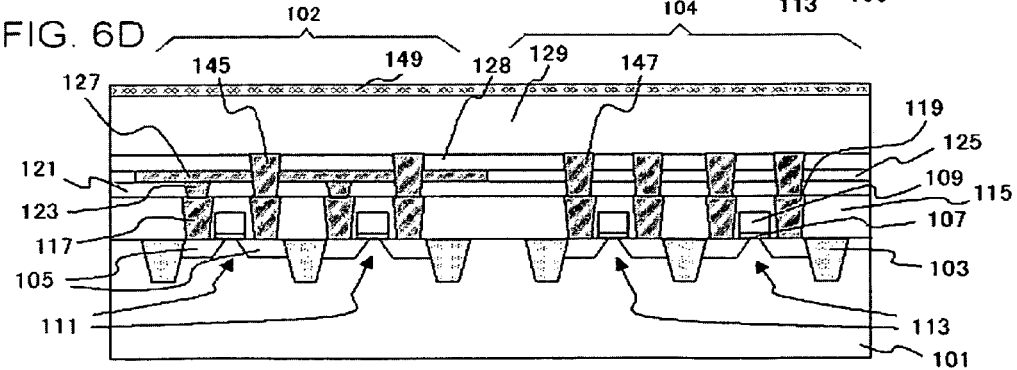

SEMICONDUCTOR DEVICE AND METHOD OF MANUFACTURING THE SAME

This application is based on Japanese patent application No. 2004-162340, the content of which is incorporated hereinto by reference.

BACKGROUND OF THE INVENTION

1. Field of the Invention

The present invention relates to a semiconductor device and a method of manufacturing the same.

2. Description of the Related Art

Semiconductor devices carrying thereon a combination of a logic region and a capacitor element region require many steps for manufacturing, and hence a reduction in production lead time has been focused on. Conventionally, the actual production is started only after establishing the design of all reticles to be employed, which inevitably prolongs the lead time. On the other hand, in the case of starting the production prior to establishing the design of the reticles, the semiconductor device has to be reworked from start, each time the reticle is modified because of a design change of the device. This naturally leads to an increase in the manufacturing cost.

As an attempt to shorten the lead time, JP-A Laid Open No. 2002-289817 proposes a semiconductor integrated circuit including a gate array section and an intellectual properties (hereinafter, abbreviated as IP) section. In the semiconductor device disclosed in JP-A Laid Open No. 2002-289817, a source and a drain diffusion layers and a gate electrode of a transistor, as well as a part of an interconnect of the respective sections are formed in advance through a front-end wafer process, to be used in common for all products. Such an arrangement reportedly allows reducing a production lead time of a sample product.

SUMMARY OF THE INVENTION

However, it has now been discovered that in the structure according to the cited document, the interconnect is formed in a different height in the gate array section and in the IP section, through the front-end process. This makes the front-end process relatively complicated. Besides, the structure requires forming in advance a capacitor element for a memory cell, in the IP section. In this aspect, the present inventors have recognized that forming a capacitor element in the front-end process for a memory cell in the IP section leads to degradation in performance of the capacitor element.

Upon analyzing possible causes of the degradation in performance of the capacitor element, the present inventors have investigated and then recognized that a capacitor film constituting the capacitor element is susceptible to deterioration when stored over a certain period of time. Accordingly, the present inventors have vigorously studied on a technique of temporarily suspending the production at a stage before forming a capacitor element in the capacitance section, for promptly responding a subsequent design change, thus resulting in the achievement of the present invention.

According to the present invention, there is provided a method of manufacturing a semiconductor device, comprising a first process of forming a first transistor constituting a memory region and a second transistor constituting a logic region on a main surface of a semiconductor substrate; a second process of forming a first insulating layer on the semiconductor substrate so as to cover the first transistor and the second transistor; a third process of forming a plurality of first conductive plugs penetrating through the first insulating layer and connected to a diffusion layer of the first transistor, and a plurality of second conductive plugs penetrating through the first insulating layer and connected to a diffusion layer of the second transistor; a fourth process of forming on the first transistor a bit line connected to one of the first conductive plugs and a capacitor element connected to one of the first conductive plugs, as well as forming on the second transistor an upper interconnect connected to one of the second conductive plugs via at least a conductive plug; and forming a protection layer on the main surface after the third process, and storing the semiconductor substrate for a predetermined period of time, with the protection layer provided.

In the method thus arranged, the semiconductor substrate is stored for a predetermined period of time, with the protection layer provided on the main surface, after the third process. Such arrangement allows building the semiconductor device up to a predetermined stage in advance, and resuming the production at the time that the reticle pattern has been established. In the foregoing method, a part of the first conductive plugs may be formed as an isolated plug that is connected neither to the bit line nor to the capacitor element. Also, a part of the second conductive plugs may be formed as an isolated plug not connected to the upper interconnect. Further, any of the capacitor contact plugs or the third conductive plugs may be formed as an isolated plug not connected to the capacitor element or to the upper interconnect, respectively. Therefore, the method allows appropriately coping with a probable reticle modification, and thereby executing the production in a shorter lead time. In addition, since the capacitor element is formed after the storage period of the semiconductor substrate, the capacitor element can be prevented from deterioration.

In the present invention, the isolated plug designates the first conductive plug that is connected neither to the capacitor element nor to the bit line, the capacitor contact plug that is not connected to the capacitor element, a bit line connection contact plug (bit contact plug) that is not connected to the bit line, the second conductive plug that is not connected to the upper interconnect, and the third conductive plug that is not connected to the upper interconnect. Also, in the present invention, the at least one conductive plug connecting the upper interconnect and the second conductive plug is a conductive plug not included in the first conductive plugs and the second conductive plugs, for example a third conductive plug to be subsequently referred to. Between the upper interconnect and the second conductive plug, one or more conductive plugs may be interposed.

It is also to be noted that the term "logic region" herein is used in a broad sense, including various circuit configurations, for example a region where a peripheral circuit of a memory region, such as a circuit for a sense amplifier or a circuit for an address selector, is provided. In the semiconductor device according to the present invention, the logic region may include a circuit in a periphery of the memory region.

According to the present invention, there is provided a semiconductor device, comprising a semiconductor substrate; a memory region provided on the semiconductor substrate; and a logic region provided on the semiconductor substrate; wherein the memory region includes: a first transistor provided on the semiconductor substrate, a first insulating layer covering the first transistor, a plurality of first conductive plugs connected to a diffusion layer of the first transistor and terminated on an upper surface of the first insulating layer, a capacitor element provided on the first insulating layer, and a bit line provided on the first insulating layer; wherein the logic region includes: a second transistor provided on the semiconductor substrate and covered with the first insulating layer, a plurality of second conductive plugs connected to a diffusion layer of the second transistor and terminated on an upper surface of the first insulating layer, and an upper interconnect provided on the second conductive plug; wherein the plurality of second conductive plugs includes a plug connected to the upper interconnect via at least one conductive plug; and wherein the plurality of first conductive plugs includes a plug connected to the capacitor element, a plug connected to the bit line, and an isolated plug connected neither to the capacitor element nor to the bit line.

Here, the foregoing method according to the present invention may include executing the step of storing the semiconductor substrate between the third process and the fourth process, and the fourth process may include leaving a part of the plurality of first conductive plugs as an isolated plug connected neither to the bit line nor to the capacitor element.

In the semiconductor device according to the present invention, the first conductive plugs include the isolated plug connected neither to the bit line nor to the capacitor element. Therefore, an adequate layout of the first conductive plugs is provided, so as to secure sufficient designing freedom of the layout of the capacitor elements, even when the design of the memory region is changed. Such arrangement allows storing the first plugs formed in advance on the semiconductor substrate until a design of an upper structure is determined, and connecting an appropriate plug out of the first conductive plugs to the capacitor element, once the design is determined. As a result, the production lead time can be shortened.

Also, in the semiconductor device according to the present invention, the first conductive plugs and the second conductive plugs are terminated on an upper surface of the first insulating layer, in other words located at a same level on the main surface, i.e. at a same height from the main surface. Accordingly, the first conductive plugs and the second conductive plugs can be formed at a time through one and the same process, which simplifies the manufacturing process.

In the semiconductor device according to the present invention, the plurality of second conductive plugs may include a plug connected to the upper interconnect and an isolated plug not connected to the upper interconnect. Adopting such structure effectively shortens the lead time, while securing high designing freedom for the upper structure.

According to the present invention, there is provided a semiconductor device, comprising a semiconductor substrate; a memory region provided on the semiconductor substrate; and a logic region provided on the semiconductor substrate; wherein the memory region includes: a first transistor provided on the semiconductor substrate, a first insulating layer covering the first transistor, a plurality of first conductive plugs connected to a diffusion layer of the first transistor and terminated on an upper surface of the first insulating layer, a capacitor element provided on the first insulating layer, and a bit line provided on the first insulating layer; the logic region includes: a second transistor provided on the semiconductor substrate and covered with the first insulating layer, a plurality of second conductive plugs connected to a diffusion layer of the second transistor and terminated on an upper surface of the first insulating layer, and an upper interconnect provided on the second conductive plug; wherein the plurality of first conductive plugs includes a plug connected to the capacitor element and a plug connected to the bit line; and wherein the plurality of second conductive plugs includes a plug connected to the upper interconnect via at least one conductive plug, and an isolated plug not connected to the upper interconnect.

Here, the foregoing method according to the present invention may further include executing the step of storing the semiconductor substrate between the third process and the fourth process, and the fourth process may include leaving a part of the plurality of second conductive plugs as an isolated plug not connected to the upper interconnect.

According to the present invention, the second conductive plugs include the isolated plug not connected to the upper interconnect. Therefore, an adequate layout of the second conductive plugs is provided so as to secure sufficient designing freedom of the upper interconnect layout, even when the design of the logic region is changed. Such arrangement allows storing the second plugs formed in advance on the semiconductor substrate until a design of an upper structure is determined, and connecting an appropriate plug out of the second conductive plugs to the upper interconnect, once the design is determined. As a result, the production lead time can be shortened.

In the semiconductor device according to the present invention, the memory region may include a plurality of capacitor contact plugs connected to the first conductive plugs and terminated on an upper surface of the second insulating layer provided on the first insulating layer, and a plurality of bit contact plugs connected to the first conductive plugs; and the logic region may include a plurality of third conductive plugs connected to the second conductive plugs and terminated on an upper surface of the second insulating layer; and the plurality of capacitor contact plugs may include a plug connected to the capacitor element; the plurality of bit contact plugs may include a plug connected to the bit line; the plurality of third conductive plugs may include a plug connected to the upper interconnect; and the plurality of first conductive plugs may include a plug connected to the capacitor element via the capacitor contact plug, a plug connected to the bit line via the bit contact plug, and an isolated plug connected neither to the capacitor contact plug nor to the bit contact plug.

In the device thus constructed, since a plurality of the first conductive plugs includes the isolated plug connected neither to the capacitor contact plug nor to the bit contact plug, an adequate layout of the first conductive plugs is provided in the first insulating layer so that sufficient designing freedom of a layout of the capacitor contact plug and the bit contact plug in the memory region is secured. Such arrangement allows storing the semiconductor substrate after forming the first insulating layer until a design of the capacitor element or the bit line is determined. The first conductive plugs are also disposed so as to be commonly applicable to a plurality of semiconductor devices having a different design of the capacitor element or the bit line. This allows taking a prompt reaction to a design change of the capacitor element or the bit line.

Also, in the semiconductor device according to the present invention, the capacitor conductive plugs and the third conductive plugs are terminated on an upper surface of the second insulating layer, in other words located at a same level on the main surface, that is, at a same height from the main surface. Accordingly, the capacitor conductive plugs and the third conductive plugs can be formed at a time through one and the same process, which simplifies the manufacturing process. Further, the first conductive plugs and the second conductive plugs, as well as the capacitor contact plugs and the third conductive plugs can be respectively formed at a time through one and the same step. This simplifies the manufacturing process for building the semiconductor device up to a state ready for the storage.

In the semiconductor device according to the present invention, the memory region may include a plurality of capacitor contact plugs connected to the first conductive plugs and terminated on an upper surface of the second insulating layer provided on the first insulating layer, and a plurality of bit contact plugs connected to the first conductive plugs; and the logic region may include a plurality of third conductive plugs connected to the second conductive plugs and terminated on an upper surface of the second insulating layer; the plurality of bit contact plugs may include a plug connected to the bit line; the plurality of third conductive plugs may include a plug connected to the upper interconnect; and the plurality of capacitor contact plugs may include a plug connected to the capacitor element and an isolated plug not connected to the capacitor element.

Here, in the foregoing method according to the present invention, the fourth process may include leaving a part of the plurality of capacitor contact plugs as an isolated plug not connected to the capacitor element.

Providing a certain number of isolated plugs not connected to the capacitor element, among the plurality of capacitor contact plugs in the second insulating layer, can secure a sufficient room for subsequent readjustment in advance, which may be made according to a design change of the capacitor element.

In the semiconductor device according to the present invention, the memory region may include a plurality of capacitor contact plugs connected to the first conductive plugs and terminated on an upper surface of the second insulating layer provided on the first insulating layer, and a plurality of bit contact plugs connected to the first conductive plugs; and the logic region may include a plurality of third conductive plugs connected to the second conductive plugs and terminated on an upper surface of the second insulating layer; and the plurality of capacitor contact plugs may include a plug connected to the capacitor element; the plurality of bit contact plugs may include a plug connected to the bit line; the plurality of third conductive plugs may include a plug connected to the upper interconnect; and the plurality of second conductive plugs may include a plug connected to the upper interconnect via the third conductive plug, and an isolated plug not connected to the third conductive plug.

In the device thus constructed, since the second conductive plugs include the isolated plug not connected to the third conductive plug, an adequate layout of the second conductive plugs is provided in the first insulating layer so that sufficient designing freedom for the upper interconnect in the logic region is secured. Such arrangement allows storing the semiconductor substrate after forming the first insulating layer until a design of the upper interconnect is determined. The second conductive plugs are also disposed so as to be commonly applicable to a plurality of semiconductor devices having a different design of the upper interconnect. This allows taking a prompt reaction to a design change of the upper interconnect.

In the semiconductor device according to the present invention, the memory region may include a plurality of capacitor contact plugs connected to the first conductive plugs and terminated on an upper surface of the second insulating layer provided on the first insulating layer, and a plurality of bit contact plugs connected to the first conductive plugs; and the logic region may include a plurality of third conductive plugs connected to the second conductive plugs and terminated on an upper surface of the second insulating layer; and the plurality of capacitor contact plugs may include a plug connected to the capacitor element; the plurality of bit contact plugs may include a plug connected to the bit line; and the plurality of third conductive plugs may include a plug connected to the upper interconnect and an isolated plug not connected to the upper interconnect.

Here, in the foregoing method according to the present invention, the fourth process may include leaving a part of the plurality of third conductive plugs as an isolated plug not connected to the upper interconnect.

Providing a certain number of isolated plugs not connected to the upper interconnect, among the plurality of third conductive plugs in the second insulating layer, can secure a sufficient room for subsequent readjustment in advance, which may be made according to a design change of the upper interconnect.

In the semiconductor device according to the present invention, the memory region may include a plurality of capacitor contact plugs connected to the first conductive plug and terminated on an upper surface of the second insulating layer provided on the first insulating layer, and a plurality of bit contact plugs connected to the first conductive plug; and the logic region may include a plurality of third conductive plugs connected to the second conductive plug and terminated on an upper surface of the second insulating layer; and the plurality of capacitor contact plugs may include a plug connected to the capacitor element; the plurality of third conductive plugs may include a plug connected to the upper interconnect; and the plurality of bit contact plugs may include a plug connected to the bit line, and an isolated plug not connected to the bit line.

Here, in the foregoing method according to the present invention, the fourth process may include leaving a part of the plurality of bit contact plugs as an isolated plug not connected to the bit line.

Providing a certain number of isolated plugs not connected to the bit line, among the plurality of bit contact plugs in the second insulating layer, can secure a sufficient room for subsequent readjustment in advance, which may be made according to a design change of the bit line.

In the method according to the present invention, the fourth process may include forming a second insulating layer on the first insulating layer; forming a plurality of bit contact plugs in the second insulating layer so as to be connected to the first conductive plug and the bit line; and simultaneously forming a plurality of capacitor contact plugs penetrating through the second insulating layer and connected to the first conductive plug and the capacitor element, and a plurality of third conductive plugs penetrating through the second insulating layer and connected to the second conductive plug and the upper interconnect; and the step of forming the capacitor element in the fourth process may be preceded by the step of storing the semiconductor substrate. Such arrangement allows shortening the lead time while preventing degradation of the characteristic of the capacitor element.

In the semiconductor device according to the present invention, the bit contact plug and the bit line may be buried in the second insulating layer. Such a structure improves the stability of the bit line during the manufacturing process.

In the semiconductor device according to the present invention, the capacitor element may be located on the bit line. Also, in the method according to the present invention, the fourth process may include forming the capacitor element on the bit line. Such arrangement improves the stability of the capacitor element during the manufacturing process, and provides higher designing freedom of the capacitor element layout.

In the semiconductor device according to the present invention, the memory region may include a DRAM cell.

Such a structure provides further increases the designing freedom of the memory region.

According to the present invention, locating an isolated plug connected neither to a capacitor element nor to a bit line in a memory region, or locating an isolated plug not connected to an upper interconnect in a logic region provides a semiconductor device that can be easily readjusted according to a design change made halfway of the manufacturing process, and a method of manufacturing such a semiconductor device.

BRIEF DESCRIPTION OF THE DRAWINGS

The above and other objects, advantages and features of the present invention will be more apparent from the following description taken in conjunction with the accompanying drawings, in which:

FIGS. 5A and 5B are schematic cross-sectional drawings for explaining the manufacturing process of the semiconductor device of FIG. 1;

FIGS. 6A to 6D are schematic cross-sectional drawings for explaining the manufacturing process of the semiconductor device of FIG. 1;

DETAILED DESCRIPTION OF THE INVENTION

The present invention will be now described herein with reference to illustrative embodiments. Those skilled in the art will recognize that many alternative embodiments can be accomplished using the teachings of the present invention and that the invention is not limited to the embodiments illustrated for explanatory purposed.

Referring to the accompanying drawings, embodiments of the present invention will be described hereunder. Throughout all the drawings, same constituents are given an identical number, and detailed description thereof may be omitted when appropriate.

First Embodiment

Figure 1:
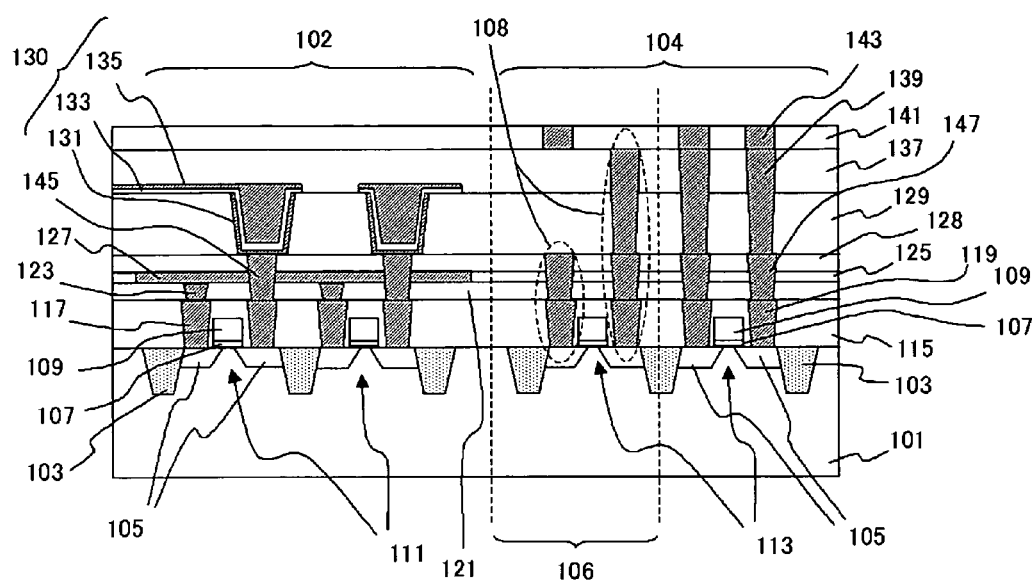
FIG. 1 is a schematic cross-sectional view showing a structure of a semiconductor device according to a first embodiment.

FIG. 1 is a schematic cross-sectional view showing a structure of a semiconductor device according to the first embodiment. A semiconductor device 100 shown in FIG. 1 includes a memory region 102 and a logic region 104 provided in combination on a main surface of a silicon substrate 101. The logic region 104 includes an isolated region 106, which includes an isolated plug 108. Details of the isolated region 106 and the isolated plug 108 will be described later.

In the semiconductor device 100, a first insulating layer 115, a second insulating layer 121, a bit line layer 125, a third insulating layer 128, a fourth insulating layer 129, a fifth insulating layer 137 and a first interconnect layer 141 are layered in this sequence on the silicon substrate 101. While FIG. 1 shows the structure of the semiconductor device 100 up to the first interconnect layer 141, additional layers including a metal layer may be provided on the first interconnect layer 141.

The memory region 102 includes a plurality (for example two as shown in FIG. 1) of memory transistors 111, located on the silicon substrate 101. The memory transistor 111 includes a diffusion layer 105, a gate oxide film 107 and a gate electrode 109, and the diffusion layer 105 is surrounded by an isolation region 103 buried in the silicon substrate 101.

The memory transistor 111 is covered with the first insulating layer 115. The first insulating layer 115 includes a plurality of memory transistor connection plugs 117. The memory transistor connection plugs 117 are connected to the diffusion layer 105 of the memory transistor 111, and terminated on an upper surface of the first insulating layer 115.

The second insulating layer 121 includes a plurality of bit contact plugs 123, buried therein. The bit contact plugs 123 are located on an upper surface of the first insulating layer 115, so as to be connected to the memory transistor connection plug 117.

The bit line layer 125 on the second insulating layer 121 includes a bit line 127 buried therein so as to be connected to the bit contact plug 123. While all the bit contact plugs 123 are connected to the bit line 127 according to FIG. 1, it is only necessary that at least one of the bit contact plugs 123 be connected to the bit line 127, as will be later described.

A plurality of capacitor contact plugs 145 is provided, penetrating through the second insulating layer 121, bit line layer 125 and the third insulating layer 128. The capacitor contact plugs 145 are connected to the memory transistor connection plugs 117. Also, the capacitor contact plugs 145 are terminated on an upper surface of the third insulating layer 128.

While all the memory transistor connection plugs 117 are connected to either of the bit contact plug 123 or the capacitor contact plug 145 according to FIG. 1, the semiconductor device 100 may include a memory transistor connection plug 117 that is connected neither to the bit contact plug 123 nor to the capacitor contact plug 145, as will be later described.

The fourth insulating layer 129 includes a through hole that reaches the capacitor contact plug 145. The inner side wall of the through hole and the upper face of the capacitor contact plug 145 are covered with a lower electrode 131. The bottom face of the lower electrode 131 is in contact with the capacitor contact plug 145. Over the lower electrode 131, a capacitor film 133 is provided in direct contact therewith. Over the capacitor film 133, an upper electrode 135 is provided so as to fill in the through hole.

The capacitor element 130 includes the lower electrode 131, the capacitor film 133 and the upper electrode 135. In the semiconductor device 100, a plurality of capacitor elements 130 may share the upper electrode 135. The upper surface of the upper electrode 135 is covered with the fifth insulating layer 137.

In the logic region 104, a plurality (for example two as shown in FIG. 1) of logic transistors 113 is provided on the silicon substrate 101. The logic transistor 113 includes diffusion layers 105, a gate oxide film 107, and a gate electrode 109, and the diffusion layer 105 is surrounded by an isolation region 103 buried in the silicon substrate 101.

The logic transistor 113 is covered with the first insulating layer 115. The first insulating layer 115 includes a plurality of logic transistor connection plugs 119. The logic transistor connection plugs 119 are connected to the diffusion layers 105 in the logic transistor 113, and terminated on an upper surface of the first insulating layer 115, like the memory transistor connection plug 117.

A plurality of first interconnection plugs 147 is provided, penetrating through the second insulating layer 121, the bit line layer 125 and the third insulating layer 128. The first interconnection plug 147 is terminated on an upper surface of the third insulating layer 128, like the capacitor contact plug 145. Some of the first interconnection plugs 147 are connecting the logic transistors 113 and the first interconnects 143. While all the logic transistor connection plugs 119 are connected to the first interconnection plug 147 according to FIG. 1, it is only necessary that at least one of the logic transistor connection plugs 119 be connected to the first interconnection plug 147.

A plurality of the second interconnection plugs 139 is provided, penetrating through the fourth insulating layer 129 and the fifth insulating layer 137. The second interconnection plugs 139 are connected to the first interconnection plug 147, and terminated on an upper surface of the fifth insulating layer 137.

The first interconnect layer 141 provided on the fifth insulating layer 137 includes a first interconnect 143. A portion of the first interconnect 143 is connected to the logic transistor 113 via the second interconnection plug 139, the first interconnection plug 147 and the logic transistor connection plug 119. The first interconnect 143 is located at a higher level than the capacitor element 130.

In the logic region 104, a plurality of the logic transistor connection plugs 119 includes a plug connected to the first interconnect 143 and an isolated plug 108 not connected to the first interconnect 143. Also, some of the first interconnection plugs 147 and the second interconnection plugs 139 (two of the first interconnection plugs 147 and one of the second interconnection plugs 139, in FIG. 1) are the isolated plugs 108 not connected to the first interconnect 143.

Figure 2:
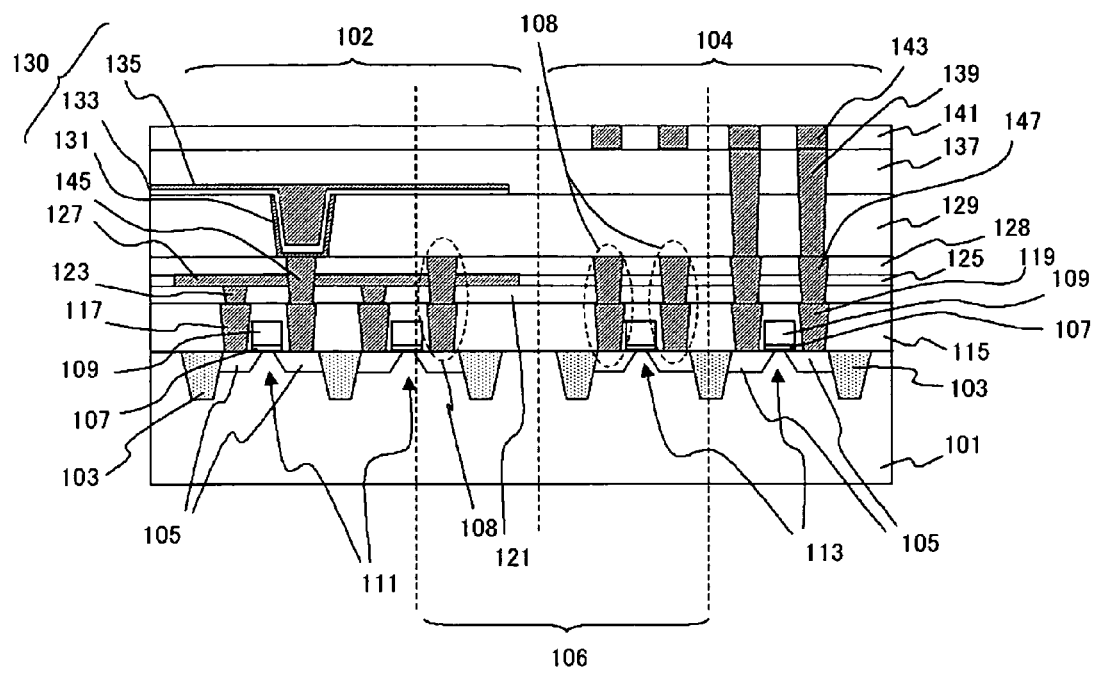
FIG. 2 is a schematic cross-sectional view showing a structure of a semiconductor device according to a second embodiment.
Figure 3:
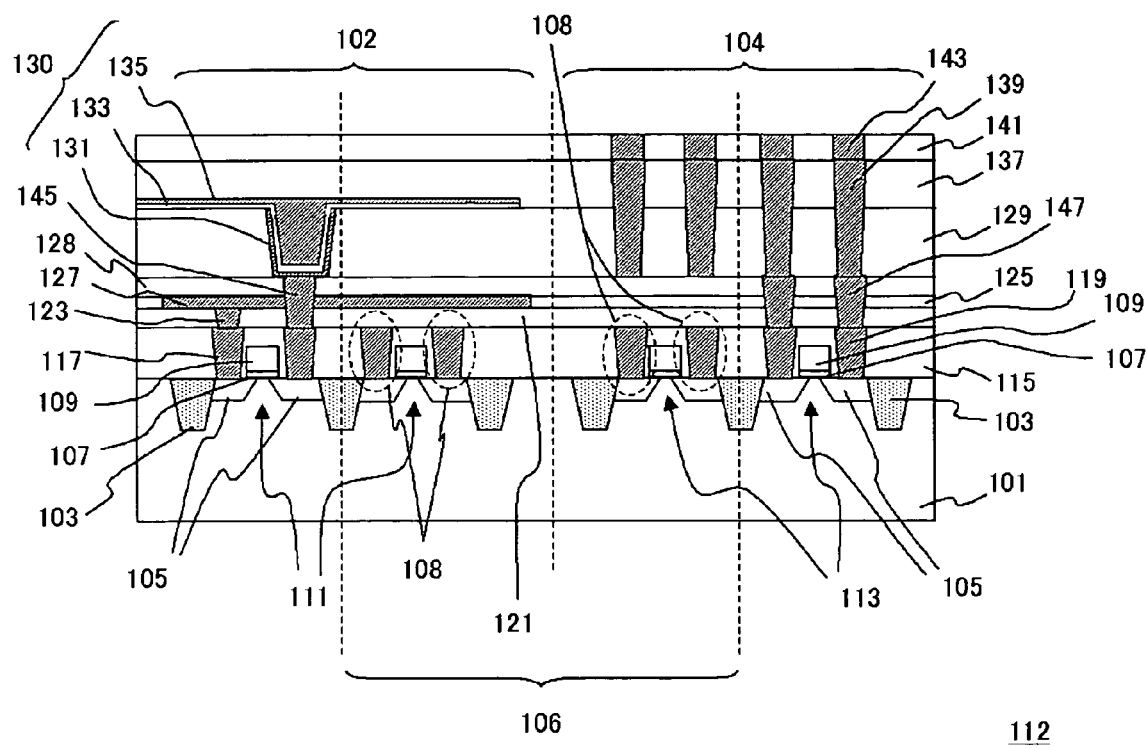
FIG. 3 is a schematic cross-sectional view showing a structure of a semiconductor device according to a third embodiment.
Figure 9:
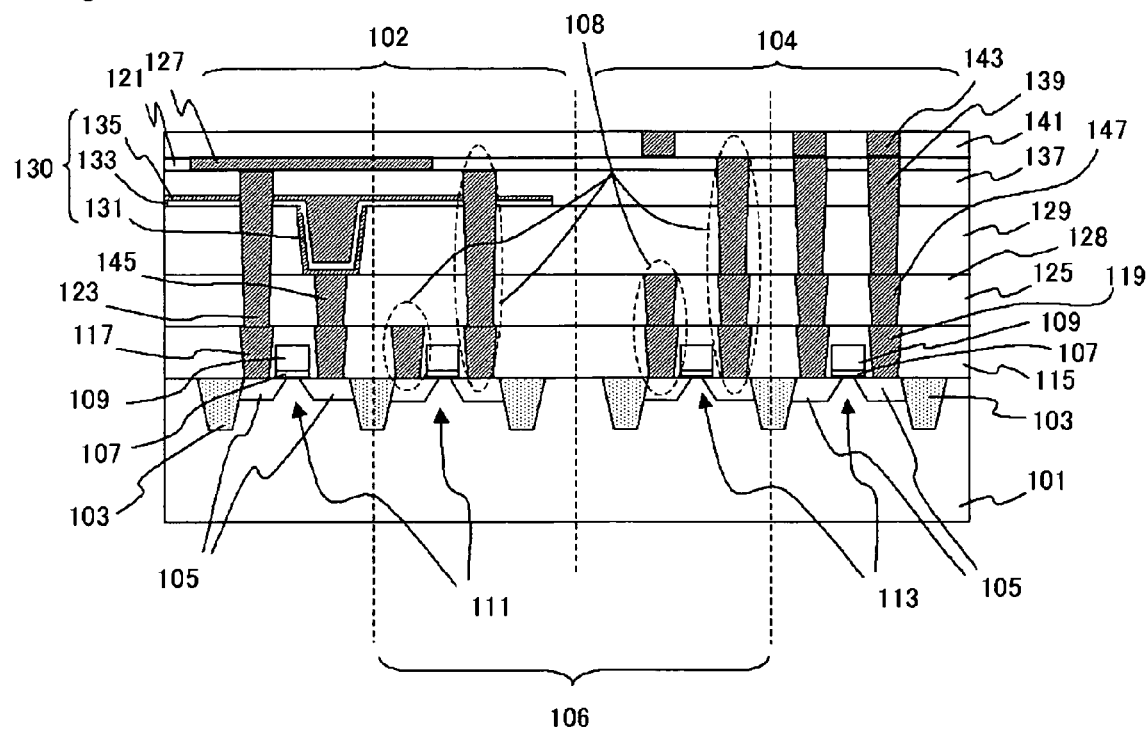
FIG. 9 is a schematic cross-sectional view showing a structure of a semiconductor device according to a fourth embodiment.

In the first and the subsequent embodiments, the isolated plug 108 is defined as one of the following. (i) Any of the logic transistor connection plugs 119, the first interconnection plugs 147 and the second interconnection plugs 139, that is not connected to the first interconnect 143 (Ref. FIGS. 1, 2, 3 and 9); (ii) Any of the memory transistor connection plugs 117 that is connected neither to the capacitor element 130 nor to the bit line 127 (Ref. FIGS. 2, 3 and 9); (iii) Any of the capacitor contact plugs 145 that is not connected to the capacitor element 130 (Ref. FIG. 2); and (iv) Any of the bit contact plugs 123 that is not connected to the bit line 127 (Ref. FIG. 9).

The isolated plug 108 is one that does not constitute a circuit, without being connected to any of the capacitor element 130, the bit line 127, the first interconnect 143, and another interconnect. In addition, the isolated region 106 designates a region occupied with the isolated plug 108 and above and below such region.

The semiconductor device 100 shown in FIG. 1 includes the isolated plug 108 according to the definition (i) described above, in the logic region 104. More specifically, the logic transistor connection plugs 119 include the plugs connected to the first interconnect 147 via the first interconnection plug 147 and the second interconnection plug 139, and the isolated plug 108 not connected to the first interconnect 143. Likewise, the first interconnection plugs 147 include the plugs connected to the first interconnect 143 via the second interconnection plug 139, and the plug not connected to the first interconnect 143. Further, the second interconnection plugs 139 include the plugs connected to the first interconnect 143, and the plug not connected to the first interconnect 143.

In other words, in the logic region 104 of the semiconductor device 100, the logic transistor connection plug 119 not connected to the second interconnection plug 139, the first interconnection plug 147 not connected to the second interconnection plug 139, the logic transistor connection plug 119 not connected to the first interconnect 143, the first interconnection plug 147 not connected to the first interconnect 143, and the second interconnection plug 139 not connected to the first interconnect 143 are the isolated plugs 108. The semiconductor device 100 further includes the first interconnect 143 not connected to the second interconnection plug 139.

Also, the semiconductor device 100 has incurred a loss of the second interconnection plug 139 and the first interconnect 143 in the isolated region 106. Such loss indicates that there has been a design change with respect to the layers including the second interconnection plug 139 and the first interconnect 143, after starting the production of the semiconductor device 100.

A method of manufacturing the semiconductor device 100 shown in FIG. 1 will now be described. FIGS. 4A to 4C, 5A to 5B, 6A to 6D, 7A to 7C, and 8 are schematic cross-sectional drawings for explaining the manufacturing process of the semiconductor device 100.

Figure 4A:
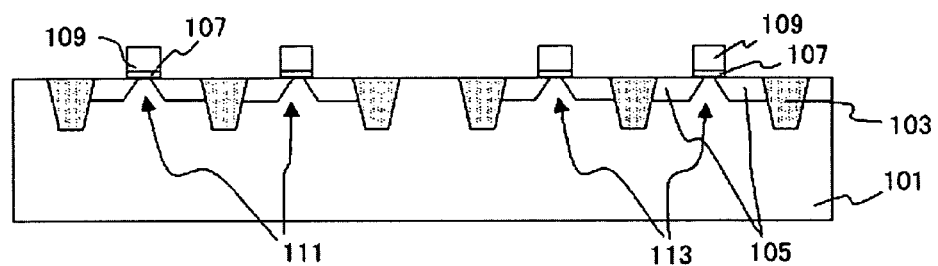
FIGS. 4A to 4C are schematic cross-sectional drawings for explaining the manufacturing process of the semiconductor device of FIG. 1.

Referring first to FIG. 4A, an isolation region 103, a memory transistor 111 and a logic transistor 113 are formed on a silicon substrate 101. Then an etch-stopper layer (not shown) and a first insulating layer 115 are sequentially formed all over the silicon substrate 101, thus to cover the memory transistor 111 and the logic transistor 113. As the etch-stopper layer, an SiN layer may be deposited by a plasma CVD process. As the first insulating layer 115, an $SiO_2$ layer may be layered by a plasma CVD process. Alternatively, to constitute the first insulating layer 115, an insulating interlayer of low dielectric constant may be first provided, for example by coating an L-Ox (trademark) layer or depositing an SiOC layer by plasma CVD, and then the $SiO_2$ layer may be deposited over the low-k interlayer dielectric, thus to form a stacked layer.

Then a dry etching is performed on the first insulating layer 115 to selectively and simultaneously remove a region for memory transistor connection plugs 117 in the memory region 102 and a region for logic transistor connection plugs 119 in the logic region 104. This is followed by another dry etching to etch back the etch-stopper layer (not shown) so as to expose the diffusion layer 105, thus to form connection holes.

Figure 4B:
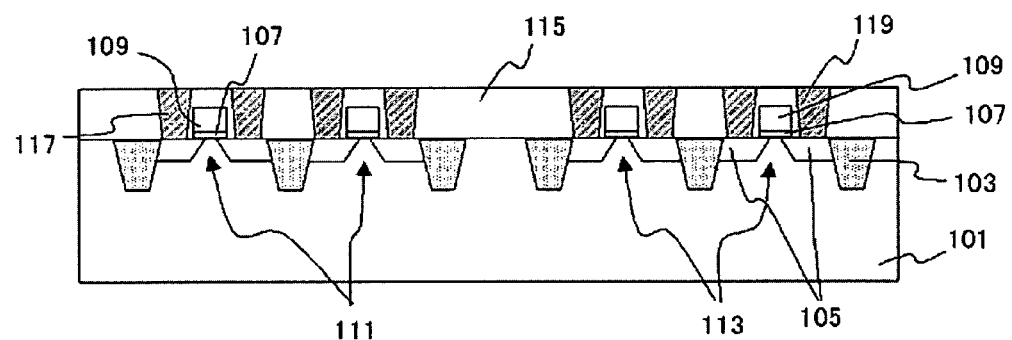

Thereafter a TiN layer (not shown) which is to serve as a barrier metal layer is deposited by a sputtering process, and a W (tungsten) layer (not shown) is deposited on the barrier metal layer by a metal organic CVD process so as to fill the connection hole. A portion of the barrier metal layer and the tungsten layer laid on the first insulating layer 115 is then removed by a CMP (Chemical Mechanical Polishing) process, so that the memory transistor connection plugs 117 and the logic transistor connection plugs 119 are formed (FIG. 4B).

Figure 4C:
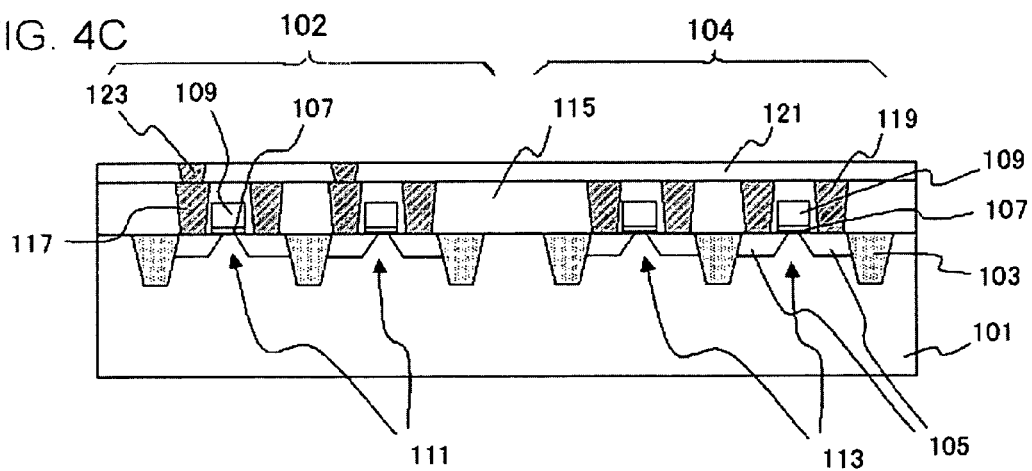

The second insulating layer 121 is then deposited on the first insulating layer 115, and a similar step to that of forming memory transistor connection plugs 117 and the logic transistor connection plugs 119 is performed to form the bit contact plug 123 in the second insulating layer 121 in the memory region 102 (FIG. 4C). This is followed by formation of the insulating layer for the bit line layer 125 on the second insulating layer 121, and of bit line 127 in the bit line layer 125 in the memory region 102, so as to be connected to the bit contact plug 123 (FIG. 5A). After that, the third insulating layer 128 is deposited on the bit line layer 125.

Then connection holes are formed so as to penetrate through the third insulating layer 128, bit line layer 125 and the second insulating layer 121, at the positions to form the capacitor contact plug 145 in the memory region 102 and at the positions to form the first interconnection plug 147 in the logic region 104, and a similar step to that of forming memory transistor connection plugs 117 and the logic transistor connection plugs 119 is performed to form the capacitor contact plug 145 and the first interconnection plug 147 (FIG. 5B). After that, the fourth insulating layer 129 is deposited on the third insulating layer 128.

Upon reaching a predetermined stage anterior to the formation of the fourth insulating layer 129 on the third insulating layer 128, the semiconductor device 100 halfway built is stored for a predetermined period of time. For example, the halfway built semiconductor device 100 may be stored at a predetermined stage after forming the memory transistor connection plug 117 and the logic transistor connection plug 119 in the first insulating layer 115. FIGS. 6A to 6D are schematic cross-sectional drawings for explaining a storage method of the semiconductor device 100.

FIGS. 6A to 6D respectively depict a stage where the second insulating layer 121 has been formed after the step of FIG. 4B, a stage where the bit line layer 125 has been formed after the step of FIG. 4C, a stage where the third insulating layer 128 has been formed after the step of FIG. 5A, and a stage where the fourth insulating layer 129 has been formed after the step of FIG. 5B, which are ready for storage of the halfway built semiconductor device 100. As shown in FIGS. 6A to 6D, upon reaching the predetermined stage, a protection film 149 is stuck all over the upper surface of the main surface of the silicon substrate 101. The semiconductor device 100 is stored with the protection film 149 adhered thereto. Such arrangement allows securely protecting the chip formation region until a design of an upper interconnect and connection plug is determined and a resist delineating the pattern thereof is made up.

The protection film 149 includes a base material and an adhesive layer provided on one of the surfaces thereof. The base material may be constituted of a polyolefin-based resin or a polyester-based resin, for example. Specifically, a polyethylene terephthalate may be employed for example.

The adhesive to be contained in the adhesive layer may be an acrylic-based emulsion adhesive, an acrylic-based solvent adhesive, an urethane-based adhesive or the like. The adhesive layer may be constituted of an optically separating material that foams and separates upon irradiation of a UV ray. Alternatively, a thermally separating material that separates by heat may be employed.

Once the design of the upper layers has been established, the production of the semiconductor device 100 is resumed. When an optical separation type material is employed for the adhesive layer of the protection film 149, a light ray having a wavelength that causes the material to foam is irradiated on the semiconductor device 100, to thereby remove the protection film 149.

In the case where the production has been suspended in the state shown in FIGS. 6A to 6C, the foregoing step up to the formation of the first interconnection plug 147 as shown in FIG. 5B is first performed, followed by the formation of the fourth insulating layer 129, before proceeding to subsequent steps. In the case where the production has been suspended in the state shown in FIG. 6D, a subsequent step may be entered upon removing the protection film 149.

Figure 7A:
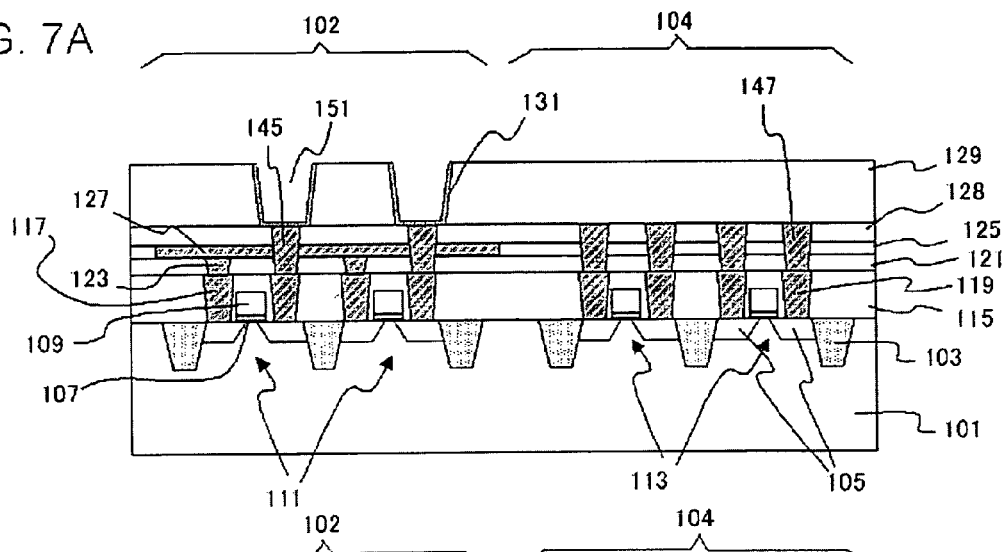
FIGS. 7A to 7C are schematic cross-sectional drawing for explaining the manufacturing process of the semiconductor device of FIG. 1.

Then, as shown in FIG. 7A, an etching is performed to selectively define a region where the capacitor element 130 is to be formed in the memory region 102, thus to form a capacitor element connection hole 151 that reaches an upper face of the capacitor contact plug 145. A barrier metal layer (not shown) and a metal layer, such as a copper layer which is to serve as a and the lower electrode 131, are then deposited all over the upper surface of the fourth insulating layer 129 including the inner wall of the capacitor element connection hole 151. On the fourth insulating layer 129, a resist pattern is placed so as to cover the capacitor element connection hole 151 leaving the remaining region exposed, to thereafter remove the metal layer except from the region where the capacitor element 130 is to be provided, by dry etching for example. At this stage, the lower electrode 131 is formed that covers the side wall of the capacitor element connection hole 151 in the fourth insulating layer 129 and the upper face of the capacitor contact plug 145, and fills a portion of the capacitor element connection hole 151 (FIG. 7A).

Figure 7B:
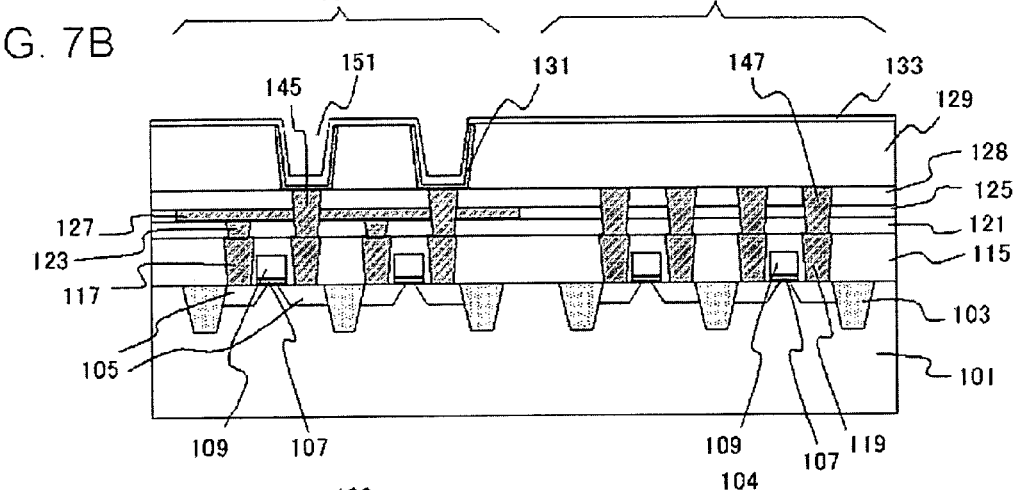

Referring now to FIG. 7B, the capacitor layer 133 is deposited all over the fourth insulating layer 129. The capacitor layer 133 is formed so as to cover the exposed surface of the lower electrode 131 and fills a portion of the capacitor element connection hole 151. The capacitor layer 133 may be constituted of SiN, for example. Alternatively, a high dielectric constant (high-k) film such as $HfO_2$ or $ZrO_2$ may be employed. The capacitor layer 133 may be deposited by a CVD process or an ALD (Atomic Layer Deposition) process. A thickness of the capacitor layer 133 may be appropriately set according to a capacity of the capacitor element 130, and a preferable range is 10 nm to 100 nm.

Figure 7C:
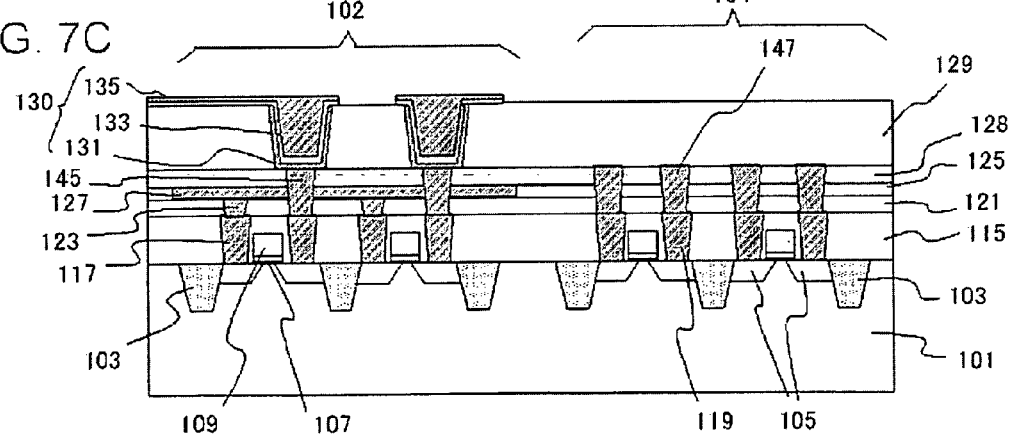

A barrier metal layer and a metal layer such as a copper layer are sequentially deposited in the capacitor element connection hole 151, by a similar method to forming the memory transistor connection plug 117, so as to fill the capacitor element connection hole 151 with the metal layer. Further, an unnecessary portion of the metal layer and the capacitor layer 133 located thereunder are removed, for example by etching (FIG. 7C). At this stage, the upper electrode 135 has been formed. The upper electrodes 135 may be constituted in one continuous body, so as to fill the capacitor element connection holes 151 and to cover a plurality of capacitor elements 130. That is the formation process of the capacitor element 130.

Figure 8:
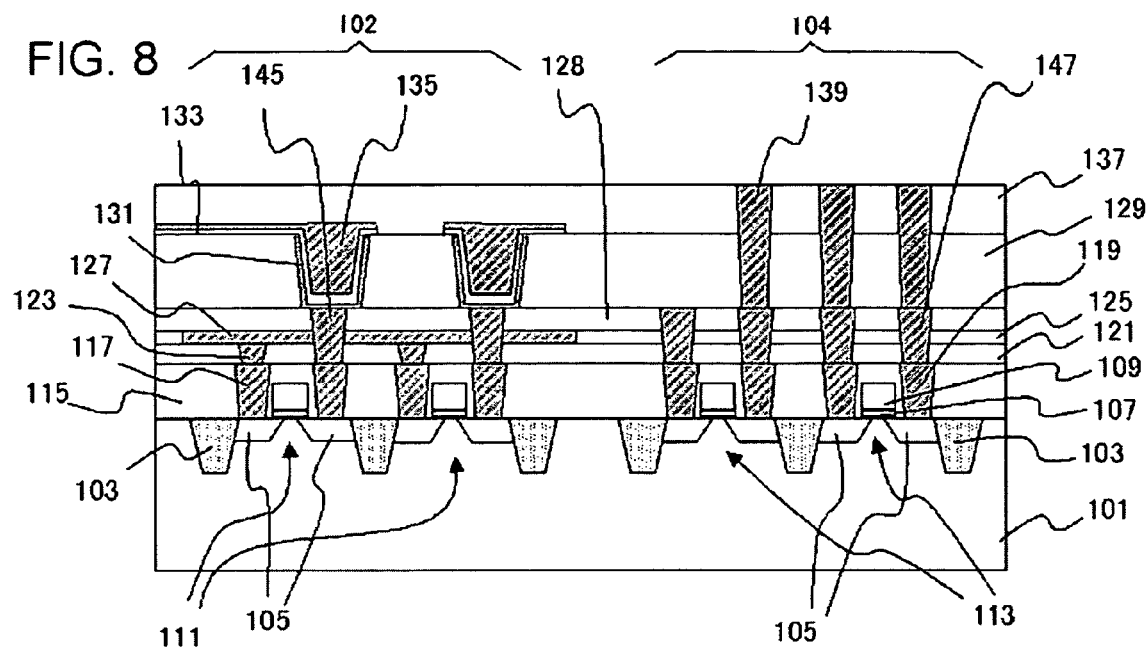
FIG. 8 is a schematic cross-sectional drawing for explaining the manufacturing process of the semiconductor device of FIG. 1.

Thereafter, the fifth insulating layer 137 is deposited over the capacitor film 133, so as to cover the upper electrode 135. A through hole is made at the position to form the second interconnection plug 139 in the logic region 104, so as to penetrate through the fifth insulating layer 137 and the fourth insulating layer 129 thus to reach the upper face of the first interconnection plug 147. Then a similar step to those of forming other plugs is performed, to form the second interconnection plug 139 (FIG. 8).

Further, an insulating layer for the first interconnect layer 141 is deposited on the insulating layer 137, and the first interconnect 143 is formed in the first interconnect layer 141 so as to be connected to the second interconnection plug 139, in a similar step to that of forming the plugs. That is how the semiconductor device 100 shown in FIG. 1 is made up.

Advantageous effects of the semiconductor device 100 shown in FIG. 1 will now be described.

In the manufacturing method of the semiconductor device 100 shown in FIG. 1, the process can be suspended at the step of forming the fourth insulating layer 129, or a preceding step. Then the production can be resumed when the layout and configuration of the second interconnection plug 139, the capacitor element 130 and the first interconnect 143 to be formed in the memory region 102 and the logic region 104 have been determined.

In this instance, the memory region 102 includes a sufficient number of memory transistor connection plugs 117 for making an adjustment when the configuration and layout of the bit line 127 or the capacitor element 130 are determined. Likewise, the logic region 104 includes a sufficient number of logic transistor connection plugs 119 for achieving the subsequently determined configuration and layout of the first interconnect 143.

Also, the memory transistor connection plugs 117 are connected to an adequate number of capacitor contact plugs 145 and the bit contact plugs 123 to allow various subsequent adjustments. Likewise, the logic transistor connection plugs 119 are connected to an adequate number of the first interconnection plugs 147 and the second interconnection plugs 139 to allow various subsequent adjustments.

Accordingly, it is not necessary to put in service all of the memory transistor connection plugs 117, the capacitor contact plugs 145, the logic transistor connection plugs 119, the first interconnection plugs 147, or the second interconnection plugs 139, but some may be selectively left as isolated plugs 108 depending on a connection layout based on a design of the upper layers. In the structure shown in FIG. 1, the logic transistor connection plug 119, the first interconnection plug 147, and the second interconnection plug 139 are left as the isolated plugs.

Also, the halfway built semiconductor devices shown in FIGS. 6A to 6D include a commonly applicable lower layer that can be fabricated in advance. Such common structure provides sufficient designing freedom of upper layers, as stated above. For example, when the design of the first interconnect layer 141 has been changed, the second interconnection plug 139 may be formed at a predetermined position, thereby leaving some of the logic transistor connection plugs 119 as the isolated plug 108. In this way, the commonly applicable design of the lower layers allows shortening the production lead time by executing the fabrication beforehand, and also provides sufficient flexibility in modifying the design depending on the configuration of the first interconnect 143. Such a benefit becomes more prominent in the case of storing the semiconductor device after forming the capacitor contact plugs 145 and the first interconnection plugs 147 (FIG. 6D).

Further, the semiconductor device 100 according to the first embodiment can prevent degradation in characteristics of the capacitor element 130 caused by deterioration of the capacitor film 133, since the semiconductor device is stored before the formation of the capacitor element 130. Therefore, the semiconductor device 100 maintains excellent memory characteristics and logic circuit characteristics.

Further, the memory transistor connection plug 117 in the memory region 102, and the logic transistor connection plug 119 in the logic region 104 are buried in the first insulating layer 115, and of a same height. Accordingly, these plugs can be formed at a time in one and the same step (FIG. 4B), which simplifies the manufacturing process. Such an advantage becomes more prominent when the memory transistor connection plug 117 and the logic transistor connection plug 119 are designed to have generally the same shape.

Still further, the capacitor contact plugs 145 in the memory region 102, and the first interconnection plug 147 in the logic region 104 are buried in the third insulating layer 128, the bit line layer 125 and the second insulating layer 121, and of a same height. Accordingly, these plugs can be formed at a time in one and the same step (FIG. 5B), which simplifies the manufacturing process. Such an advantage becomes more prominent when the capacitor contact plug 145 and the first interconnection plug 147 are designed to have generally the same shape.

Figure 10A:
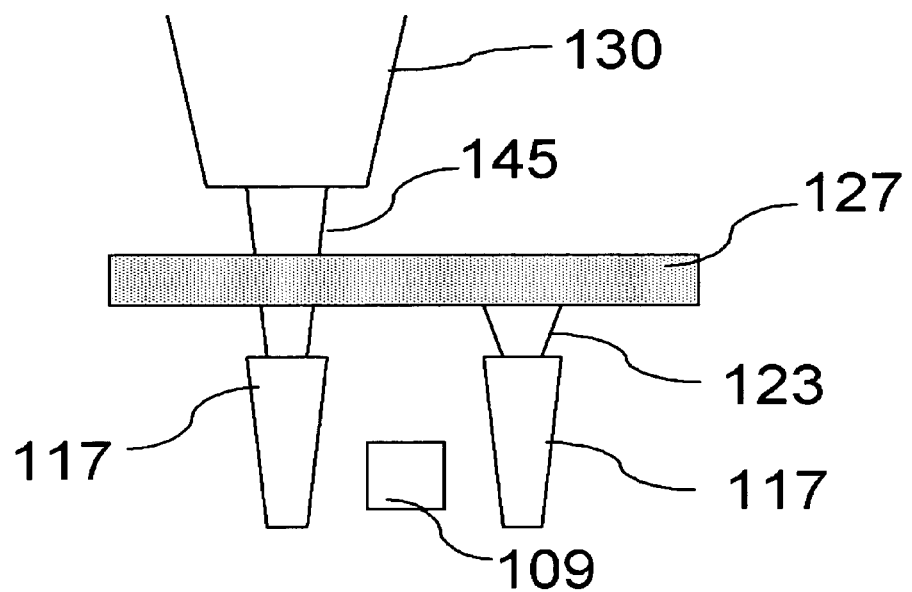
FIGS. 10A to 10B are schematic fragmentary cross-sectional views showing a structure of the semiconductor device according to the first embodiment.
Figure 10B:
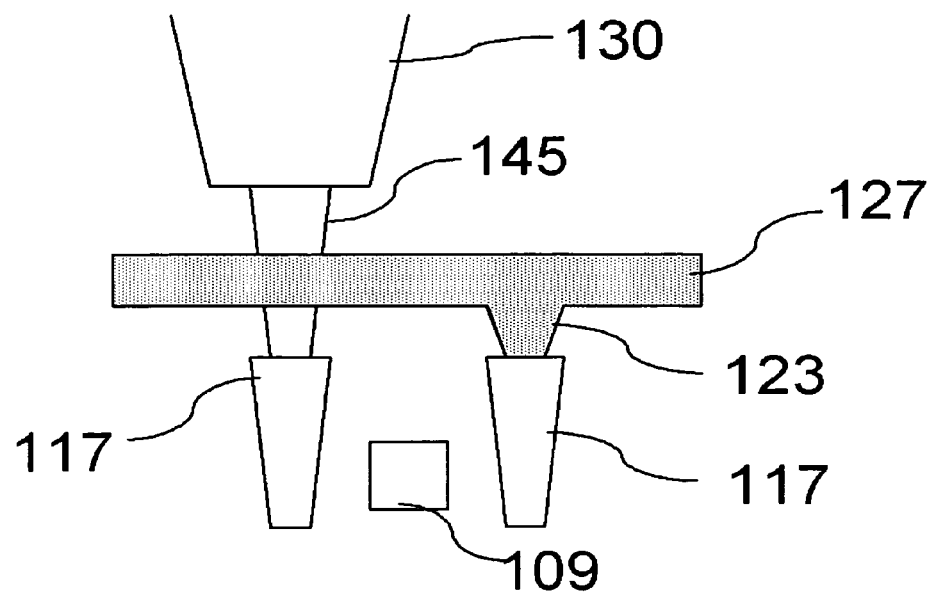

In the semiconductor device 100 shown in FIG. 1, the bit contact plug 123 and the bit line 127 are formed in different steps from separate materials, however these may be formed in a continuous one body. FIGS. 10A and 10B depict such method.

FIG. 10A is an enlarged fragmentary view schematically showing the structure of the semiconductor device 100 shown in FIG. 1. The capacitor element 130 is provided in an upper layer of the bit line 127. Here, FIGS. 10A and 10B illustrate the bit contact plug 123 on the side of the logic region 104, unlike semiconductor device 100 shown in FIG. 1 in which the capacitor contact plug 145 is located on the side of the logic region 104. Either of these configurations may be adopted.

FIG. 10B is an enlarged fragmentary view schematically showing a state that the bit contact plug 123 and the bit line 127 are formed in a continuous one body, under the layout of FIG. 10A. The term "in a continuous one body" herein means integrally formed in a single body. Also, it is preferable that the bit contact plug 123 and the bit line 127 are made of a single member without any joint. To achieve the structure shown in FIG. 10B, the same material common to the bit contact plug 123 and the bit line 127 is supplied into inside of the through hole for forming the bit contact plug 123 when forming the bit line 127, thus to simultaneously for the bit contact plug 123 and the bit line 127. Such arrangement eliminates the need to separately form the bit contact plug 123 as an independent contact plug, for connecting the bit line 127 and the memory transistor connection plug 117. Therefore, connection to the bit line 127 can be securely assured by adopting such simple structure. Besides, a connection resistance can be reduced.

In the subsequent passages on other embodiments, differences from the semiconductor device 100 according to the first embodiment will be primarily described.

Second Embodiment

FIG. 2 is a schematic cross-sectional view showing a structure of a semiconductor device according to the second embodiment. The basic structure of the semiconductor device 110 shown in FIG. 2 is similar to that of the semiconductor device 100 shown in FIG. 1, with an exception that the memory region 102 and the logic region 104 include the isolated plug 108.

The semiconductor device 110 includes the isolated plugs 108 according to the foregoing definitions (ii) and (iii) in the memory region 102, and the isolated plugs 108 according to the foregoing definition (i) in the logic region 104. More specifically, in the memory region 102, a plurality of the memory transistor connection plugs 117 includes a plug connected to the bit line 127 via the bit contact plug 123, a plug connected to the capacitor element 130 via the capacitor contact plug 145, and the isolated plug 108 connected neither to the bit line 127 nor to the capacitor element 130. In this structure, some of the capacitor elements 130 (for example one, as in FIG. 2) are missing, and hence the capacitor contact plugs 145 include a plug connected to the capacitor element 130 and another plug not connected to the capacitor element 130. Here, the capacitor contact plug 145 not connected to the capacitor element 130, and the memory transistor connection plug 117 connected to such capacitor contact plug 145 are the isolated plugs 108.

Likewise, in the logic region 104 some of the second interconnection plugs 139 (for example two, as in FIG. 2) are missing, and hence the first interconnection plug 147 not connected to the first interconnect 143, and the logic transistor connection plug 119 that is connected to such first interconnection plug 147 not connected to the first interconnect 143 are the isolated plugs 108.

The absence of the capacitor element 130 and the second interconnection plug 139 indicates that there has been a design change of elements or interconnects in the fourth insulating layer 129, after starting the production of the semiconductor device 110.

The semiconductor device 110 according to the second embodiment offers the following benefit, in addition to those offered by the semiconductor device 100 (FIG. 1) of the first embodiment.

In the structure of the semiconductor device 110 shown in FIG. 2, the memory region 102 also includes a portion of the isolated region 106. Such a structure provides sufficient flexibility in making a necessary adjustment in response to a design change of the capacitor element 130 or the bit line 127 in the memory region 102. Since the production of the semiconductor device 110 can be suspended, once the capacitor contact plug 145 and the first interconnection plug 147 have been formed, at the stage of forming the fourth insulating layer 129 or at a preceding stage, the production can be resumed at the time when the configuration and layout of the second interconnection plug 139, the capacitor element 130 and the first interconnect 143 to be provided in the memory region 102 and in the logic region 104 have been determined.

In this embodiment, it is not necessary to put in service all of the memory transistor connection plugs 117, the capacitor contact plugs 145, the logic transistor connection plugs 119, or the first interconnection plugs 147, but some may be selectively left as isolated plugs 108 depending on a connection layout based on a design of the upper layers.

Further, also the semiconductor device 110 according to this embodiment can prevent degradation in characteristics of the capacitor element 130 caused by deterioration of the capacitor film 133, since the semiconductor device is stored before the formation of the capacitor element 130. Therefore, the semiconductor device 110 maintains excellent memory characteristics and logic circuit characteristics.

Also, since the production of the semiconductor device 110 can be resumed once the number of the capacitor elements 130 or connection layout of the capacitor element 130 and the diffusion layer 105 is determined, the production lead time can be shortened by executing the fabrication of the lower layers beforehand as a commonly applicable structure, and also sufficient flexibility can be secured in modifying the design depending on the required size of the capacitor element 130.

Third Embodiment

This embodiment refers to another structure of a semiconductor device including the isolated plugs 108 in both of the memory region 102 and the logic region 104. The basic structure of the semiconductor device 112 shown in FIG. 3 is similar to that of the semiconductor device 100 shown in FIG. 1, with an exception that the memory region 102 and the logic region 104 include the isolated plug 108.

The semiconductor device 112 includes the isolated plugs 108 according to the foregoing definition (ii) in the memory region 102, and the isolated plugs 108 according to the foregoing definition (i) in the logic region 104. More specifically, in the memory region 102, some of the capacitor contact plugs 145 and the bit contact plugs 123 are missing, and hence the isolated plugs 108 are present, which are not connected to the capacitance elements 130 and the bit line 127. Likewise, in the logic region 104 some of the first interconnection plugs 147 (for example two, as in FIG. 3) are missing, and hence some of the logic transistor connection plugs 119 are left as the isolated plugs 108, without being connected to the first interconnection plug 147.

In the manufacturing process of the semiconductor device 112, the production may be suspended, for example once the memory transistor connection plug 117 and the logic transistor connection plug 119 have been formed, upon completing the step of forming the second insulating layer 121 (FIG. 6A). And the production can be resumed at the time that the configuration and layout of the bit contact plug 123, the bit line 127 and the capacitor element 130 in the memory region 102, as well as the configuration and layout of the first interconnection plug 147, the second interconnection plug 139 and the first interconnect 143 in the logic region 104 have been determined. Upon resuming the production, all of the memory transistor connection plugs 117 and the logic transistor connection plugs 119 do not have to be put in service, but some may be selectively left as the isolated plug 108, depending on a choice of a connection with an upper layer based on a design of the upper layer.

Such arrangement provides increased flexibility in making a necessary adjustment in response to a design change of the bit line 127 or the capacitor element 130 in the memory region 102, and of the first interconnect layer 141 in the logic region 104. Also, as in the first and the second embodiments, the memory region 102 and the logic region 104 respectively include an adequate number of memory transistor connection plugs 117 and the logic transistor connection plugs 119 in the first insulating layer 115, so as to secure sufficient designing freedom of an upper structure. Therefore, the structure up to the first insulating layer 115 can be utilized as a common lower structure, which allows executing flawless production within a shorter lead time.

Fourth Embodiment

While the capacitor element 130 is located on the bit line 127 in the semiconductor devices according to the foregoing embodiments, the bit line 127 may be provided on the capacitor element 130.

FIG. 9 is a schematic cross-sectional view showing a structure of a semiconductor device according to the fourth embodiment. In the semiconductor device 114 shown in FIG. 9, the structure of the logic region 104 is basically the same as that of the semiconductor device 100 shown in FIG. 1. In the memory region 102 of the semiconductor device 114, the bit line 127 is provided atop the capacitor element 130. Also, the first interconnect 143 is provided at a level higher than the bit line 127. The bit contact plugs 123 located in the memory region 102 include a plug connected to the bit line 127 and a plug not connected to the bit line 127.

In the semiconductor device 114, the memory region 102 includes the isolated plug according to the foregoing definition (iv). More specifically, in the memory region 102, a portion of the bit line 127 is deleted at the initial stage of the designing, and hence one or more memory transistor connection plugs 117 and one or more bit contact plugs 123 are left as the isolated plug 108. The memory region 102 also includes the isolated plug 108 according to the foregoing definition (ii), and the logic region 104 includes the isolated plug 108 according to the foregoing definition (i).

When adopting such a structure, the production of the semiconductor device may be suspended upon completing the step of forming the fourth insulating layer 129, or a preceding step. And the production can be resumed once the configuration of the bit line 127 has been determined. Thereafter, it is not necessary to put in service all of the bit contact plugs 123, but some (for example one, as in FIG. 9) may be selectively left as the isolated plug 108, depending on a choice of a connection with the upper layer based on a design of the upper layer.

Accordingly, the semiconductor device 114 provides sufficient flexibility in making an adjustment in response to a design change of the bit line 127 in the memory region 102, and also allows executing the production within a shorter lead time because of the commonly applicable lower layer design that can be fabricated in advance. Such benefit becomes more prominent when the production of the semiconductor device is suspended upon completing the stage of forming the fourth insulating layer 129. Also, providing the bit line 127 in an insulating layer laid over the capacitor element 130 equally enhances such benefit.

While the memory transistor connection plug 117 and the capacitor element 130 are connected via the capacitor contact plug 145 in the semiconductor device 114 shown in FIG. 9, the memory transistor connection plug 117 may be directly connected to the capacitor element 130.

Figure 11A:
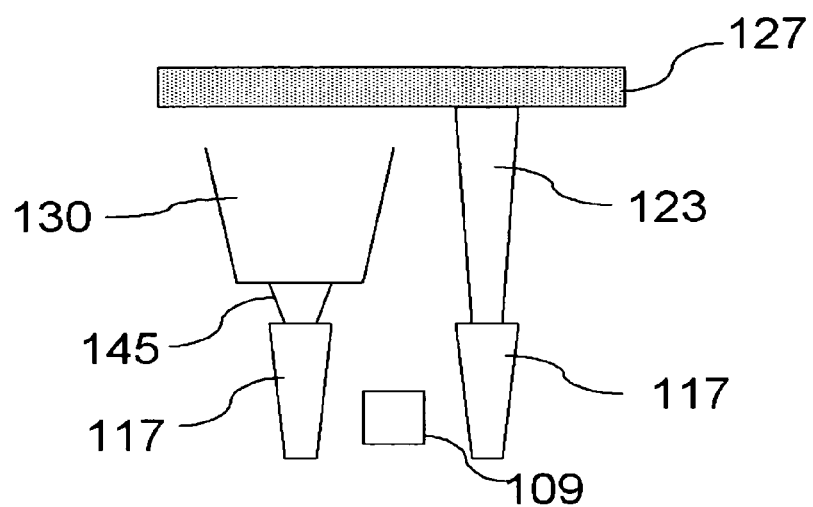
FIGS. 11A to 11C are schematic fragmentary cross-sectional views showing a structure of the semiconductor device according to the fourth embodiment.
Figure 11B:
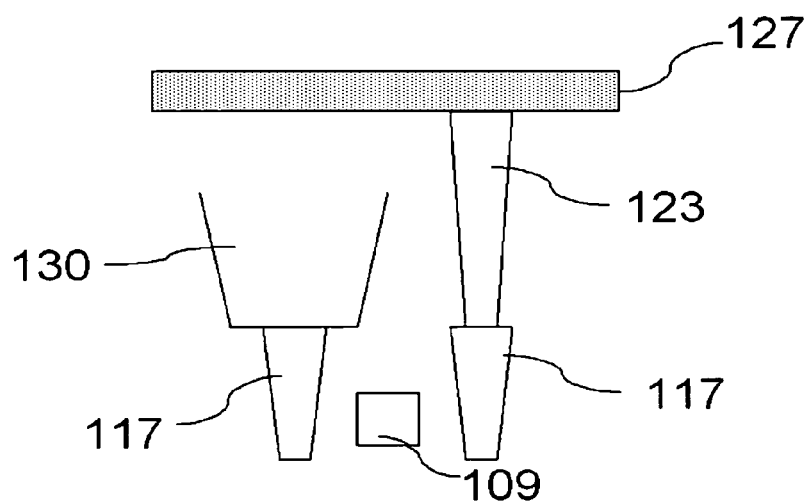
Figure 11C:
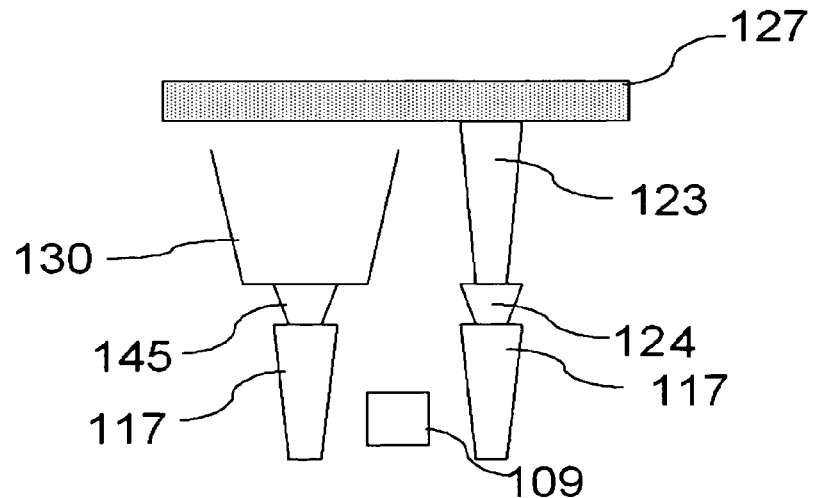

FIG. 11A is an enlarged schematic cross-sectional view showing a part of the semiconductor device 114 shown in FIG. 9. In FIG. 11A, the bit line 127 is provided in an upper layer of the capacitor element 130. In FIGS. 11A to 11C, the bit contact plug 123 is located on the side of the logic region 104, unlike the semiconductor device 114 of FIG. 9 in which the capacitor contact plug 145 is located on the side of the logic region 104, however either configuration may be employed.

In FIG. 11B, the capacitor contact plug 145 is not provided, and hence the upper face of the memory transistor connection plug 117 is in contact with the bottom face of the lower electrode (not shown in FIG. 11B) of the capacitor element 130. Such structure as FIG. 11B ensures the electrical connection to the capacitor element 130, and also simplifies the device, thus leading to achievement of a thinner device.

While the memory transistor connection plug 117 and the bit line 127 are connected via a bit contact plug 123 in the semiconductor device 114 shown in FIG. 9, a plurality of contact plugs may be interposed between the memory transistor connection plug 117 and the bit line 127.

FIG. 11C is a schematic cross-sectional drawing of the foregoing structure. In FIG. 11C, the upper face of the memory transistor connection plug 117 is in contact with a contact plug 124, which is located in the same layer as the capacitor contact plug 145 and of the same shape as the capacitor contact plug 145, and the upper face of such contact plug 124 is in contact with the bit contact plug 123. This structure allows simultaneously forming the contact plug 124 to be utilized for connection to the bit line 127, in the step of forming the capacitor contact plug 145, to thereby simplify the manufacturing process.

Although the embodiments of the present invention have been described in details referring to the drawings, it is to be understood that they are only exemplary, and that various modifications may be alternatively employed.

Also, each of the first insulating layer 115 to the fifth insulating layer 137, the bit line layer 125, the insulating layer constituting the first interconnect layer 141, and the capacitor layer 133 may be constituted of a stacked layer.

Further, in the foregoing embodiments, an oxide or a silicate containing one or more of Hf, Zr, Al, La, Y and Ta may be employed to constitute the capacitor layer 133.

Further, the barrier metal layer may contain a high melting point metal such as Ti, WN, Ta or TaN, instead of TiN. Alternatively, a tantalum-based barrier metal containing stacked TaN or Ta may be employed. The barrier metal layer may be formed by a sputtering or CVD process, or the like.

Still further, various other materials other than SiN described above may be employed to constitute the etch-stopper layer, for example a material containing nitrogen such as SiCN or SiON.

Still further, the bit line 127 may be extended up to a periphery of the memory region 102. For example, the bit line 127 may be utilized as a circuit member of the logic region 104.

It is apparent that the present invention is not limited to the above embodiment, that may be modified and changed without departing from the scope and spirit of the invention.

What is claimed is:

1. A semiconductor device, comprising:
   a semiconductor substrate;
   a memory region provided on said semiconductor substrate; and
   a logic region provided on said semiconductor substrate;
   wherein said memory region includes:
   a first transistor provided on said semiconductor substrate,
   a first insulating layer covering said first transistor,
   a plurality of first conductive plugs connected to a diffusion layer of said first transistor and terminated on an upper surface of said first insulating layer,
   a capacitor element provided on said first insulating layer, and
   a bit line provided on said first insulating layer;
   wherein said logic region includes:
   a second transistor provided on said semiconductor substrate and covered with said first insulating layer,
   a plurality of second conductive plugs connected to a diffusion layer of said second transistor and terminated on an upper surface of said first insulating layer, and
   an upper interconnect provided on said second conductive plug;
   wherein said plurality of second conductive plugs includes a plug connected to said upper interconnect via at least one conductive plug; and
   wherein said plurality of first conductive plugs includes a plug connected to said capacitor element, a plug connected to said bit line, and an isolated plug connected neither to said capacitor element nor to said bit line.

2. The semiconductor device according to claim 1, wherein said plurality of second conductive plugs includes a plug connected to said upper interconnect via at least one conductive plug and an isolated plug not connected to said upper interconnect.

3. A semiconductor device comprising:
   a semiconductor substrate;
   a memory region provided on said semiconductor substrate; and
   a logic region provided on said semiconductor substrate;

wherein said memory region includes:
a first transistor provided on said semiconductor substrate, a first insulating layer covering said first transistor,
a plurality of first conductive plugs connected to a diffusion layer of said first transistor and terminated on an upper surface of said first insulating layer,
a capacitor element provided on said first insulating layer, and
a bit line provided on said first insulating layer; said logic region includes:
a second transistor provided on said semiconductor substrate and covered with said first insulating layer,
a plurality of second conductive plugs connected to a diffusion layer of said second transistor and terminated on an upper surface of said first insulating layer, and
an upper interconnect provided on said second conductive plugs via a multilayer insulating layer;
wherein said plurality of first conductive plugs includes a plug connected to said capacitor element and a plug connected to said bit line and an isolated plug connected neither to said capacitor element nor to said bit line;
wherein said logic region includes a plurality of connected plugs and a plurality of isolated plugs;
wherein said plurality of connected plugs includes at least one of said second conductive plugs and at least one conductive plug that connects said one second conductive plug with said upper interconnect; and
wherein said plurality of isolated plugs includes at least another of said second conductive plugs, said plurality of isolated plugs are not connected to said upper interconnect and are terminated at a different level of said multilayer insulating layer than said plurality of connected plugs.

4. The semiconductor device according to claim 1, wherein said memory region includes:
a plurality of capacitor contact plugs connected to said first conductive plugs and terminated on an upper surface of a second insulating layer provided on said first insulating layer, and
a plurality of bit contact plugs connected to said first conductive plugs;
said logic region includes a plurality of third conductive plugs connected to said second conductive plugs and terminated on an upper surface of said second insulating layer;

said plurality of bit contact plugs includes a plug connected to said bit line;
said plurality of third conductive plugs includes a plug connected to said upper interconnect; and
said plurality of capacitor contact plugs includes a plug connected to said capacitor element and an isolated plug not connected to said capacitor element.

5. The semiconductor device according to claim 3, wherein said memory region includes:
a plurality of capacitor contact plugs connected to said first conductive plugs and terminated on an upper surface of a further insulating layer that is a layer of said multilayer insulating layer, and
a plurality of bit contact plugs connected to said first conductive plugs;
said logic region includes a plurality of third conductive plugs connected to said second conductive plugs and terminated on an upper surface of said further insulating layer;
said plurality of capacitor contact plugs includes a plug connected to said capacitor element;
said plurality of bit contact plugs includes a plug connected to said bit line; and
said plurality of connected plugs consists of said at least one second conductive plug, said third conductive plugs and at least one conductive plug that connects said third conductive plugs with said upper interconnect; and
at least one of said isolated plugs consists of said at least another second conductive plug and said third conductive plugs and is terminated on an upper surface of said further insulating layer.

6. The semiconductor device according to claim 1, wherein said bit contact plug and said bit line are buried in a second insulating layer provided on said first insulating layer.

7. The semiconductor device according to claim 1, wherein said capacitor element is located on said bit line.

8. The semiconductor device according to claim 1, wherein said memory region includes a DRAM cell.

9. The semiconductor device according to claim 1, wherein said logic region includes a peripheral circuit of said memory region.

* * * * *